SEMICONDUCTOR AND METHOD OF FORMING BY DIFFUSION

Filed March 20, 1963

2 Sheets-Sheet 1

JOHN E. MANN,
DAVID F. KYSER,
INVENTORS.

BY THEIR ATTORNEYS

Spensley & Horn.

SEMICONDUCTOR AND METHOD OF FORMING BY DIFFUSION

Filed March 20, 1963 2 Sheets-Sheet 2

JOHN E. MANN,
DAVID F. KYSER,
INVENTORS.

BY THEIR ATTORNEYS.

Spensley & Horn.

United States Patent Office 3,244,566
Patented Apr. 5, 1966

3,244,566
SEMICONDUCTOR AND METHOD OF FORMING BY DIFFUSION
John E. Mann, Azusa, and David F. Kyser, Los Angeles, Calif., assignors to TRW Semiconductors, Inc., Lawndale, Calif., a corporation of Delaware
Filed Mar. 20, 1963, Ser. No. 266,759
10 Claims. (Cl. 148—186)

Figure 1A:
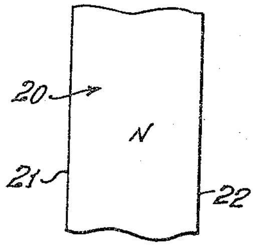
Prior Art FIG. 1A.

This invention relates to the fabrication of diffused junction semiconductor devices and more particularly to a new method for establishing the diffused junctions.

In the art of solid state electronics, the use of semiconductor materials and semiconductor devices for rectifying and controlling electrical signals is now well known. Basic to the theory of operation of semiconductor devices is the concept that electric conduction in semiconductor materials may be due to either an excess or deficiency of electrons. Current flow due to an excess of electrons is commonly referred to as "conduction by electrons" or "excess electron conduction," and current flow due to a deficiency of electrons is commonly referred to as "conduction by holes" or "deficit electron conduction." The fact that electrical conductivity by both of these processes may occur simultaneously and separately in a semiconductor specimen affords a basis for explaining the electrical behavior characteristics of semiconductor devices. One manner in which the conductivity of a semiconductor specimen may be established is by the addition of active impurities to the basic semiconductor material.

The term "semiconductor material" as utilized herein is considered generic to materials such as silicon, germanium and silicon-germanius alloys and other various compounds. Not intended to be included within the term "semiconductors material" for purposes of this invention are metal oxide such as copper oxide and the like.

In the semiconductor art, the term "active impurities" is used to denote those chemical impurities which affect the electrical characteristics of the semiconductor material as distinguished from other impurities which have no appreciable effect on these characteristics. Semiconductor material so highly purified that the remaining chemical impurities are incapable of adding or removing significant numbers (compared to those thermally generated) of free electrons in the crystal lattice is termed "instrinsic." However, active impurities are usually intentionally added to the semiconductor material to produce single crystals having predetermined electrical characteristics, such material being termed "extrinsic."

Active impurities are classified as either donors, such as antimony, arsenic, bismuth and phosphorus, or acceptors such as indium, gallium, boron and aluminum. A region of semiconductor material containing an excess of donor impurities and yielding an excess of free electrons is considered to be an impurity doped N-type region. An impurity doped P-type region is one containing an excess of acceptor impurities resulting in a deficit of electrons, or stated differently, an excess of holes. An instrinsic region may result when there is a substantially equal distribution therein of both acceptor and donor impurities, such a region will hereafter be termed a "compensated intrinsic" region as opposed to an "intrinsic" region which is substantially devoid of any active impurities.

A heavily doped region of N-type conductivity may be alternately referred to as an N+ region, the + indicating that the concentration of the active impurity in the region is significantly greater than the minimum required to determine the conductivity type. Similarly, a P+ type region would indicate a heavily doped region of P type conductivity.

When a continuous, solid crystal specimen of semiconductor material has an N type region adjacent to a P type region, the boundary between them is termed a PN or an NP junction, and the specimen of semiconductor material is termed a PN junction semiconductor device. These PN and NP junctions are referred to as rectifying junctions.

When donor impurity atoms are diffused into an N type semiconductor starting crystal of a given resistivity, a diffused N type region of a different resistivity is produced. The gradation between these two regions of similar conductivity type, but of differing resistivity is termed a "nonrectifying junction" or an N+ N or P+ P boundary, as the case may be. The term "junction," as utilized herein is intended to include only rectifying junctions.

A rectifying junction establishes a high resistance interfacial condition between two contiguous semiconductor regions of opposite conductivity types, thereby resulting in a high impedance barrier which effectively isolates one region from the other.

A non-rectifying boundary establishes an interfacial condition between two adjacent semiconductor regions of the same conductivity type, the impedance of the interfacial barrier depending upon the relative resistivities of the two regions. Non-rectifying boundaries are often employed to establish ohmic contacts by doping a surface of a semiconductor body of one conductivity type with the same conductivity type impurity to provide a surface region of lower resistivity than that of the underlying semiconductor material.

At the present state of the art, the impurity doping of semiconductor material may be accomplished by a diffusion process, typically involving the vapor-solid diffusion of the desired active impurity into the solid semiconductor crystal body. The body is placed into a furnace in which certain gases may be introduced to control the ambient conditions therein. This type of diffusion process is commonly termed an open tube diffusion process, as contrasted with the closed tube diffusion process in which diffusion is carried out in a sealed container, ordinarily in a nonoxidizing atmosphere.

The present invention is specifically directed toward the fabrication of diffused junction semiconductor devices, employing either the open tube or closed tube diffusion techniques.

In the diffusion of an active impurity into a semiconductor crystal body, the active impurity concentration is greatest at the surface and diminishes with increasing distance into the crystal. In this description, for purposes of simplicity of explanation, we will consider the "diffusion depth" as the distance from the surface into the crystal where the concentration of the active impurity atoms is equal to the concentration of the dopant or active impurity which determined the original conductivity of the region into which diffusion has taken place. The present invention method and device requires careful control of the "diffusion depth" as will hereinafter be explained.

The PN junction produced by diffusion of an active impurity of a predetermined conductivity type into a region of semiconductor material of the opposite conductivity type cannot be viewed as construing an abrupt transition from one conductivity type to the other; in fact, a diffused junction is often referred as a "graded" junction. By "graded" junction is meant a junction in which the excess impurity concentration from one conductivity determining type to the opposite conductivity determining type varies monotonically over a definite distance. At both extremes of this distance there may be clearly said to be present an excess of donor or acceptor impurities as the case may be.

The term "depletion region" as used herein means a region on either side of a PN junction (either abrupt or graded) which is substantially free of mobile carriers under equilibrium conditions.

It is generally preferable to fabricate the diffused junction semiconductor devices from starting crystal wafers of uniform impurity concentration. However, most prior art diffused junction devices, especially diodes in which low capacitance and fast switching speed with low reverse current leadage are desirable parameters, are constructed in the following manner. If the starting crystal is of N type conductivity and of a given resistivity the PN junction is provided by diffusion into one surface of the crystal of an acceptor impurity. Into the opposite surface there is generally diffused a donor impurity in order to provide an ohmic contact. This N+ diffused region also serves to reduce the series resistance of the completed device. Intermediate between the two diffused regions there remains an undiffused portion of the starting crystal; in this case it is a region of N type conductivity, the donor impurities to establish the conductivity type and the resistivity characteristics having been introduced into the starting crystal prior to the diffusion operation as herein described, such typically being done during crystal growth. It is at once apparent that the position of this undiffused portion from each of the opposed surfaces of the starting crystal as well as the width of this region is dependent upon many factors; these include the thickness and resistivity of the starting crystal, the concentration of the active impurity sources, their diffusion constants, the time of diffusion, the temperature, etc. As a result, the width and spatial position of this undiffused region is extremely difficult to accurately control.

It is well known that the electrical characteristics of a device of the type above described is in part a function of the spatial position of the undiffused region relative to the opposed surfaces of the starting crystal. It is also known that the electrical characteristics are even more dependent upon the thickness and width of such an undiffused region. Among the device characteristics which are sensitive to the position and thickness of the undiffused region is the "breakdown voltage" as well as the capacitance and forward conductance of the completed device.

The term "breakdown voltage" as utilized herein means the reverse voltage at which an appreciable increase occurs in the reverse current.

The present invention is directed toward an improved fabrication technique and device construction which renders the electrical characteristics less sensitive to the resistivity, thickness and spatial position of the undiffused region.

A further advantage of the present inventive device construction is the fact that there is achieved a substantial insensitivity to environmental radiation such as fast neutrons.

Accordingly, it is an object of the present invention to provide an improved diffusion technique for the manufacture of semiconductor devices.

It is also an object of the present invention to provide an improved diffusion technique which allows the production of diffused junction semiconductor devices having closely controlled and reproducible electrical characteristics.

It is another object of the present invention to provide an improved diffusion technique which allows the production of diffused junction semiconductor devices having electrical characteristics less sensitive to the resistivity of the starting crystal than has heretofore been possible.

It is a further object of the present invention to provide an improved diffusion technique which allows the production of diffused junction semiconductor devices characterized by low series resistance without "punch through" while still possessing desired breakdown voltage characteristics. "Punch through" voltage is that voltage at which the depletion layer (that region which is free of mobile carriers) penetrates the undiffused region or penetrates to a high conductivity region, e.g., an N+ ohmic contact region in the presently preferred embodiment hereinafter to be described.

It is still another object of the present invention to provide an improved diffusion technique which allows the production of diffused junction semiconductor devices characterized by rapid "response time." Response time of a diode is the time required for the device to change from a forward conducting or easy current flow mode to a reverse or difficult current flow mode.

It is yet another object of the present invention to provide an improved diffusion technique which allows the production of diffused junction semiconductor devices in which the "channeling effects" are minimized.

A still further object of the present invention is to provide an improved diffusion technique for the manufacture of semiconductors diodes which possess a predetermined insensitivity to environmental radiation.

The present invention device is preferably produced by effecting either a simultaneous or sequential diffusion of both acceptor and donor impurities into opposite surfaces of a silicon semiconductor crystal of a predetermined conductivity type and resistivity to a diffusion depth such that the sum of the two diffusion depths is greater than the thickness of the starting crystal. Thus, there may be said to be a "diffusion cross over." This is then followed by a gold doping of the crystal, all in a manner hereinafter to be described.

The novel features which are believed to be characteristic of the invention, both as to its organization and method of operation, together with further objects and advantages thereof, will be better understood from the following description, considered in connection with the accompanying drawing in which a presently preferred embodiment is illustrated by way of example. It is to be expressly understood, however, that the description is for the purpose of illustration and example only, and that the true spirit and scope of the invention is defined by the accompanying claims.

Figure 2A:
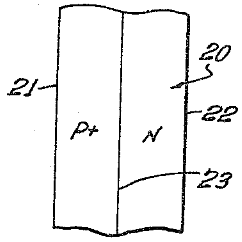
Figure 3A:
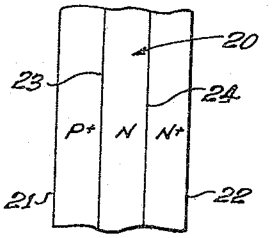
Figure 1B:
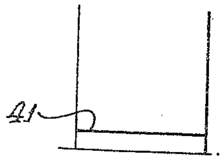
Figure 2B:
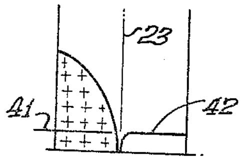
Figure 3B:
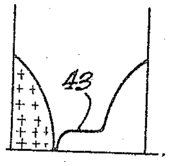
Figure 4A:
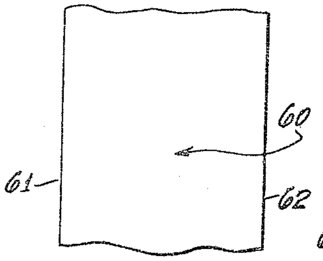

In the drawings:

FIGURES 1*a*, 2*a* and 3*a* are cross-sectional views of a silicon semiconductor crystal wafer during various intermediate successive manufacturing steps in accordance with present diffused junction diode technology;

FIGURES 1*b*, 2*b* and 3*b* are graphs corresponding to the wafer of FIGURES 1*a*, 2*a* and 3*a*, indicating the net active impurity concentration (on a logarithmic scale) across the wafer thickness;

FIGURES 4*a*–8*a* are cross-sectional views of a silicon semiconductor crystal wafer during various intermediate successive manufacturing steps in accordance with the present invention; and FIGURES 4*b*–8*b* are graphs corresponding to the wafers of FIGURES 4*a*–8*a*, indicating the active impurity concentration (on a logarithmic scale), across the wafer thickness.

Turning now to the drawings, and more particularly to FIGURES 1–3, there are shown various fabricational steps in the production of a diffused junction semiconductor diode in accordance with prior art practices. FIGURES 1*b*–3*b* are a series of graphical representations of the impurity concentration distribution within a silicon semiconductor wafer 20 of a thickness T. Each graph has a pair of coordinate axes spaced apart by the distance T. Thus, one axis of each pair represents one semiconductor wafer side surface and the other ordinate axis of each pair represents the opposite side surface, the absicssa extending between them representing points along the thickness of the wafer. The impurity concentration calibration of the ordinate axis is on a logarithmic scale, with the log of net N type impurity concentration extending upwards from the abscissa and the log of net P type impurity concentration also extending upwardly from the abscissa being differently designated. FIGURE 1*a* shows a sectional view taken through the side of a silicon semiconductor wafer 20, the wafer 20 of N type silicon of substantially uniform active impurity concentration extending through the thickness of the wafer from one surface 21 to the other surface 22. The graph of FIGURE 1*b* illustrates a uniform type impurity distribution by the horizontal line 41. Next, active impurity atoms of P type conductivity are diffused into the surface 21 of the wafer 20 to a predetermined diffusion depth, thereby establishing a PN junction, whose cross-sectional appearance is generally indicated by the reference numeral 23. The diffusant may be any group III element either in its elemental form, or in a compound which includes sufficiently available atoms of such element at the diffused temperature. Preferably, trimethoxyborozine is employed as the P type active impurity used in a manner as described and claimed in copending U.S. Patent application Serial No. 62,475, filed October 13, 1960, now Patent 3,074,215, January 2, 1963, by Alan L. Harrington, entitled "Manufacture of Semiconductor Devices."

Following this diffusion step and viewing the wafer after one side has been lapped away to the extent of the diffusion depth, the wafer will appear as shown in FIGURE 2*a*. The graph of FIGURE 2*b* shows the new impurity concentration distribution curve throughout the wafer 20 upon completion of this diffusion step, the curve being identified by the reference numeral 42. The curve 42 begins at the left-hand wafer surface 21. The impurity concentration is always shown as being upward from the abscissa regardless of type. The curve form extends to a point well above the abscissa, thereby indicating a relatively high P type impurity concentration at that surface. The P type impurity concentration decreases until it drops to a value which is insignificant with respect to the active impurity concentration of the N type base material. Thus, the curve 42 falls rather steeply to below the level of the horizontal line 41 (of FIGURE 2*b*), toward very low carrier concentrations at the PN junction 23. It then rises sharply to the right of the PN junction 23 and continues horizontally to the opposite surface 22. Originally, PN junction semiconductor diodes were fabricated by this single diffusion step, the completed device then appearing essentially as shown in FIGURE 2*a*. A semiconductor device so constructed had a tendency to exhibit relatively low forward current conduction. This being basically due to the excess (in thickness) of high resistivity base material of the starting wafer 20. This is the base region which is of higher resistivity and is typically made wider than required to produce the desired reverse voltage breakdown characteristic of the completed device. The base region is made wider than normally required as it needs to be wide enough to more than contain the depletion region of the completed device under reverse bias operating conditions. The reason for providing the wider base region is due to the inherent control difficulties in processing as herein mentioned.

Another disadvantage attendant with some prior art devices is a surface phenomenon known as "channeling." Channeling is an increase in leakage current caused by an anomalous surface conductive path, ohmic in nature, resulting from a conversion of type of a thin surface region. Such effects are particularly pronounced in high resistivity material.

In addition, the effect of reducing the base region thickness resulted in increased capacitance of the completed device. This in turn adversely affected the device recovery time.

In an effort to improve the device characteristics, later prior art practice was to diffuse atoms of N type conductivity into the right-hand wafer surface 22, either before, during, or after the P type diffusion step. By carefully controlling the diffusion depths of the P and N type active impurity atoms, a sufficient thickness of undiffused base material was left to provide the desired breakdown characteristics while providing a device with a reduced base width. Upon completion of this extra diffusion step, the wafer of FIGURE 2*a* would appear as shown in FIGURE 3*a*, the point at which the diffused N type impurity concentration drops to the level of the base semiconductor material defining an NN+ boundary at 24. FIGURE 3*b* of the drawing graphically depicts the impurity concentration curve of the wafer of FIGURE 3*a*, the curve being indicated by the reference numeral 43. Comparing the curve 43 with the curve 42, the effect of the additional N type diffusion is readily seen, the base width of the device is shown reduced to the thickness of undiffused base material extending between the boundaries 23 and 24.

Thus, an improved device resulted but its reproducibility was not sufficiently high. The undiffused base width thickness was dependent upon the difference between the thickness of the wafer less the sum of the P and N diffusion from opposite sides. As the undiffused base width thickness which was typically 0.5 mils, depends upon many variables it was difficult to consistently achieve the desired base thickness. If the undiffused base region were to be too wide there resulted a device with low forward conduction. On the other hand if it were too thin, the reverse characteristics such as leakage and breakdown characteristics were degraded.

The present invention construction and method overcomes these difficulties by eliminating the requirement of an extremely accurate undiffused base width. Instead of leaving an undiffused width of a predetermined thickness, the present invention approach actually includes an overlap or crossing-over of the P and N diffusions so that no undiffused portion remains. Subsequently gold is diffused into the device, all in a manner as will now be explained.

In FIGURE 4 there is shown a starting crystal wafer 60 of N type conductivity with a substantially uniform impurity concentration throughout. Such a wafer may be produced in accordance with well known present art practice as by pulling a single crystal from a melt to which has been added a predetermined quantity of a donor active impurity such as arsenic. Thereafter the crystal is sliced into wafers.

Figure 5A:
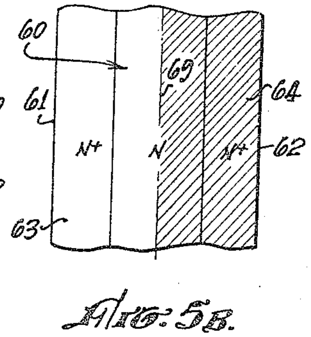
Figure 4B:
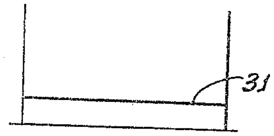
Figure 5B:
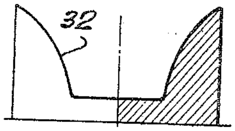
Figure 6B:
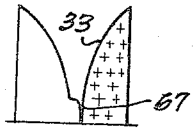

The wafer 60 has a left-hand surface 61 and a right-hand surface 62. In the graph of FIGURE 4*b* the horizontal line 31 indicated that there is a uniform N type impurity distribution between the opposed surfaces 61 and 62 of the wafer 60. Next, active impurity atoms of N type conductivity are diffused into both of the surfaces 61 and 62 to a predetermined diffusion depth, thereby resulting in a pair of NN+ boundaries separated by a region of undiffused base material. The wafer 60 then appears as shown in FIGURE 5*a*. The net impurity concentration curve of the wafer 60, upon completion of this diffusion step, is shown by the line 32 in FIGURE 5*b*. The curve 32 indicates a very high N type active impurity concentration at the wafer surfaces, the impurity concentration decreasing in accordance with the distribution peculiar to the diffusion operation until the net concentration reaches that of the N type semiconductor base material, at which point the graph levels off and extends horizontally between the two diffusion curves to indicate that the impurity concentration in that region is essentially that of the undiffused base material. The right-hand portion of wafer 60 is then removed, as indicated by the cut line 69 in FIGURE 5*a*, the shaded portion in FIGURE 5*b* being removed. The new right-hand surface of the wafer is indicated by the reference numeral 66, see FIGURE 6*a*.

Figure 6A:
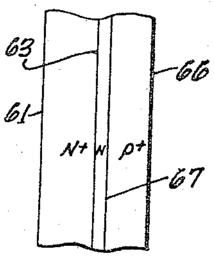

The next step is to diffuse active impurity atoms of an acceptor impurity such as boron into the right-hand surface 66 of the wafer 60 to a predetermined diffusion depth. The heating of the wafer during this diffusion operation will of necessity cause the further penetration of the N type active impurity previously diffused into the left-hand wafer surface 61. Thus, the NN+ transition indicated at 63a is moved slightly toward the right and a PN junction 67 created. The wafer then appears as shown in FIGURE 6a. The net impurity concentration curve is indicated by the reference numeral 33 in FIGURE 6b. The curve 33 indicates a high N type active impurity concentration at the wafer surface 61, the active impurity concentration decreasing with increasing distance from the surface in a manner similar to the curve 32, until the junction 63 is reached. As mentioned hereinabove, the heating of the semiconductor body during the P type diffusion operation moves the junction 63 toward the right. The curve 33 indicates a relatively high P type impurity concentration at the right-hand surface 66 of the wafer, the impurity concentration decreasing in accordance with the distribution of the particular diffusion operation used to form the PN junction 67, at which point the curve rises rapidly to the level of the original impurity concentration of the base material. The wafer, as it appears in FIGURE 6a, could be a completed diffused junction diode in accordance with the more recent prior art practice, the thickness of the high resistivity region extending between the boundaries 63 and 67 determining the breakdown voltage and capacitance characteristics of the device. However, in accordance with the present invention technique, the diffusion of both type active impurity atoms is continued until the aforementioned crossover point is reached. Thus, the diffusion operation is continued until the position of the PN junction moves past the NN+ boundary 63 to some new position 68 at the right, thereby completely eliminating the intermediate region of undiffused semiconductor base material. The wafer then appears as shown in FIGURE 7a.

Figure 7A:
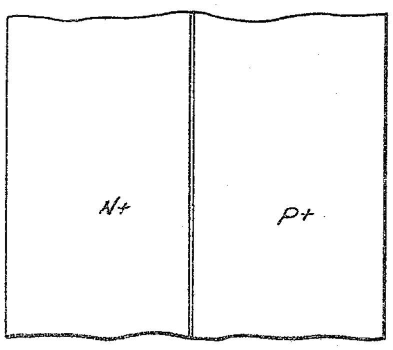
Figure 7B:
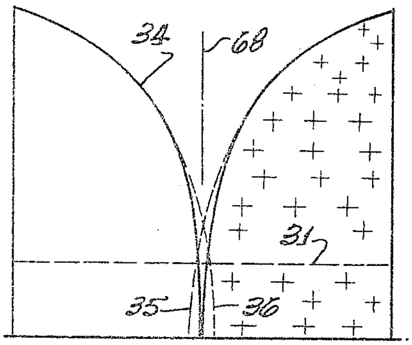

Upon diffusion to the crossover point, as shown in FIGURE 7a, there results a device having no base width, the only high resistivity semiconductor material being in the narrow region defining the PN junction 68. In FIGURE 7b, the net impurity concentration curve is shown by the solid line and indicated by the reference numeral 34. The curve 34 indicates high active impurity concentrations, of opposite conductivity types, at the two wafer surface, the impurity concentrations decreasing in accordance with the diffused distributions until the PN junction 68 is reached. The dotted line curves 35 and 36 respectively show the concentrations of the diffused acceptor and donor atoms separately, showing a relatively large amount of "cross-over." It can readily be seen that a semiconductor device, as shown by FIGURE 7a, would have a relatively low breakdown voltage due to breakdown by punch-through. For optimum application of the present invention it is important that diffusion be conducted to some crossover point if it is desired to eliminate as much as possible the effect of the original doping impurity (as indicated by the reference numeral 31) on the final device characteristics.

The last present invention fabricational step is to gold-dope the wafer of FIGURE 7a. Gold doping is known to decrease the number of majority carriers, hence increasing the resistivity to high values, the gold acting as a P type impurity in N type semiconductor material and as an N type impurity in P type semiconductor material. Gold doping also reduces carrier lifetime by introducing recombination centers into the semiconductor material, thereby increasing the switching speed of the semiconductor device, as is well known in the prior art. The gold doping of the wafer of FIGURE 7a causes the creation of a substantially widened high resistivity (near-intrinsic) region generally centered upon the crossover point (the PN junction 68), the thickness of the region increasing with the level of gold doping in the vicinity of the crossover point up to a maximum thickness determined by the maximum solubility of gold in silicon at the gold diffusion temperature used. The maximum diffused gold concentration possible is approximately $10^{17}$ atoms per cubic centimeter. (The gold concentration below the silicon surface is a function of the gold diffusion time and temperature, degree of silicon lattice perfection, and depth from the crystal surface, since in most structures the gold is not diffused to a uniform level throughout the silicon crystal body.) Because of the difficulty of quickly reaching equilibrium values, gold concentrations used for typical devices range down from saturation limits. Thus, the control of the time and temperature of the gold doping step as well as the original P and N diffusions allows creation of any desired high resistivity region thickness. If gold is diffused in to a concentration level which is substantially higher than the previously diffused impurity concentrations at the crossover point, then the net impurity concentration in the wafer will appear as shown in FIGURE 8a.

Figure 8A:
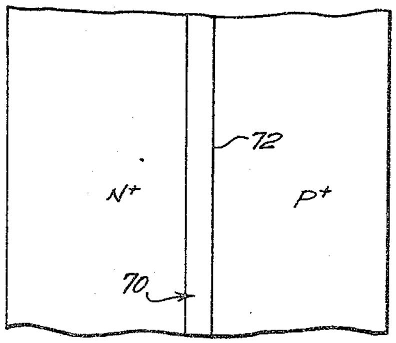
Figure 8B:
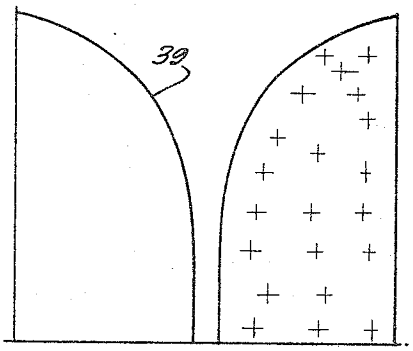

As shown in FIGURE 8a, the wafer 60 now contains an intermediate high resistivity (near-intrinsic) region 70, separated from the remaining semiconductor material by an N junction 71 and a P boundary 72. The curve 39 in the graph of FIGURE 8b shows the net impurity concentration distribution of the wafer in FIGURE 8a. The widened high resistivity region 70 is quite apparent in the curve of FIGURE 8b. It can be shown from the graph of FIGURE 8b that the device characteristics are vastly improved, and have been rendered nearly independent of the starting material resistivity for this kind of combination of process conditions. The impurity concentration curves rise sharply away from the region boundaries so that except for the near-intrinsic zone there is no significant amount of high resistivity material in the device. Thus, the series resistance of the device has been decreased. As mentioned hereinabove, lower series resistance results in improved current carrying capabilities. Furthermore, the device recovery time has been improved due to the lifetime killing effect of the gold doping.

Thus, the present invention method consists of diffusing all the way to a crossover point, followed by gold doping to a level which will provide the desired device characteristics. A practical example will now be given of the manufacture of a diffused junction semiconductor diode in accordance with the present invention concepts, following the production steps described and illustrated in FIGURES 4–8 of the drawings.

The starting crystal is an N type conductivity silicon wafer of (100) orientation 20–22 mils in thickness and approximately 1¼ inches in diameter. The bulk resistivity of the starting wafer is 4 ohm-cm. The radial variation in resistivity of the wafer should not exceed ±25%. Both sides of the wafer are nest lapped to a thickness of 12±1 mils.

A plurality of such wafers are placed into an open tube diffusion furnace with a source of phosphorus pentoxide using nitrogen gas as a carrier. The wafers should preferably be set upright in a slotted silicon boat, on edge to the gas flow within the diffusion tube. The wafers are removed from the boat and one side of each is lapped to the desired final wafer thickness, preferably 7.5 mils.

Now on the lapped side of each wafer there is applied a boron source by a paint on technique using a 25% solution of trimethoxy boroxine in methyl alcohol. The wafers are then placed on a flat boat, with the boron coating sides facing up and are slowly moved into a furnace maintained at a temperature of from 1225° C. to 1250° C. for 30 minutes. A black boron glass like coating will result on the boron side of the wafers.

The wafers are now stacked together, N side to N side and P side to P side, for subsequent placement within a diffusion furnace for simultaneous diffusion of the boron and phosphorus into the N type conductivity wafer. To create a diffusion cross-over of from 0.2 to 0.4 mils a temperature of 1250 C. for 78 hours is preferred.

Following this simultaneous diffusion operation, the wafers are separated by ultrasonic agitation in hydrofluoric acid. Now the wafers are ready for gold diffusion. Both sides of each wafer are lightly sand blasted until a uniform silicon gray color is observed after which they are cleaned in hot trichlorethylene. The wafers are then dipped into a gold chloride-hydrofluoric acid solution for approximately two minutes, or until the gold chemiplating on the surface becomes visible. The gold plating solution typically employed includes 8 gms. gold chloride, 15 ml. concentrated (30%) hydrochloric acid, 15 ml. concentrated (48%) hydrofluoric acid and 1,000 ml. of deionized water. Prior to the gold diffusion step it has been found preferable, but not necessary, to remove the gold plating from the N+ side of the wafers by mechanical rubbing, Now the wafers are stacked again like side to like side, on a quartz boat, are placed in a gold diffusion furnace for three hours at 1100° C. Following the gold diffusion step, the wafers are rapidly quenched to room temperature by removal from the furnace and placement upon an aluminum block which serves as a heat sink. The wafers should be quenched from the furnace temperature to below 300° C. in a few seconds.

Following the gold diffusion the wafers are cut into 17-mil dice and are ready for mounting in a conventional diode package.

The hereinabove-described semiconductor diffusion technique enables a semiconductor device having electrical characteristics which are relatively independent of the resistivity of the starting base material. There are also various practical aspects of the present invention process. The gold diffusion operation allows exact control of the device capacitance. Also, by checking the wafer characteristics prior to reaching the crossover point, it is possible to determine whether the crossover point has been accurately reached, thereby allowing the decision of accepting or rejecting the whole wafer before the wafer is diced into a plurality of diodes. The present invention method is particularly advantageous in the production of computer diodes, Zener diodes and Varacter diodes. In the production of these three types of devices, according to prior art methods, very close control of the base material resistivity was necessary, since it was a determining factor in the subsequent diffusion steps.

The specific example discussed results in a crossover whereby the extent of the crossover curve is preferably from 0.2 to 0.4 mil when the device is of an overall thickness less than 10 mils. This is the place where the concentration of active impurities in this example is typically $10^{15}$ atoms per centimeter. This is at the point at which the two curves representing the N and P impurities intersect.

The gold diffusion steps above-described produce a level of gold atom concentration in the crossover region which is substantially greater than the concentration of the active impurities in the region. A typical value for the gold level is $1\times10^{16}$ atoms per cubic centimeter for a device as above described.

The concentration of the gold would usually be in the range from $1\times10^{14}$ to $1\times10^{17}$ atoms per cubic centimeter the range of active impurity concentration in the crossover region may vary in a range from $1\times10^{14}$ to $1\times10^{16}$ atoms per cubic centimeter. The extent of overlap of the crossover curves may vary as indicated from 0.2 to 0.4 mil and, in fact, the overlap may extend to as much as 0.1 to 3 mil for devices ranging between 4 mils up to 15 mils in thickness. A preferred value in the given example, however, would be 0.3 mil.

The distance from the crossover point on the diffused curve at which the diffused impurity concentration curve has decreased to that of the original concentration (considered for both the P and N diffusion curves) is the extent of crossover, and has been stated, it may vary 0.3 to 3 mils. This distance will vary, in general, inversely with increased resistivity of the starting crystal.

Typical electrical characteristics of a diode device resulting from the present invention process is as follows:

$IF>20$ ma. at $+1$ volt
$E_s>75$ volts at $-5$ $\mu$a.
$I_B<100$ m$\mu$a. at $-50$ volts
$C<1.8$ $\mu\mu$f. at $-0.5$ volts, 100 kc.
$T_{rr}<1.5$ m$\mu$sec., $+10$ ma. to $-6$ volts, recovery to 1 ma.

As was previously mentioned, the present invention device has been found to be particularly resistant to various types of radiation such as neutron radiation, electron radiation and proton radiation. Many of the properties of the device depend upon the high concentration of gold. The gold has a compensating effect on the active impurities producing a high resistivity region in the crossover area. The radiation received by the device usually results in increased resistivity by displacing atoms from their substitutional positions, thus causing them to be electrically inactive; however, the resistivity is effected in this gold-compensated device to a lesser degree than if an excess gold concentration were not present. This action is due to the fact that in most gold-containing devices, the ratio of the gold to the active impurities is low, but in the present invention there is an excess of gold in the active region and, therefore, the resistivity will not change to the same extent as in prior art devices or especially in those in which there is no gold present.

Further, while gold has been described as the preferred compensating element, it is believed that other elements may similarly be employed. What is required is that the element in sufficient quantity have energy levels near the middle of the forbidden band gap, to allow the element to act either as an acceptor impurity in an N type conductivity semiconductor or as a donor impurity in a P type semiconductor to thereby compensate either P or N type semiconductor material to render it substantially less P or N type, respectively, to produce nearly intrinsic material by such compensation in the vicinity of the crossover point. The amount of the compensating element need be substantially greater in concentration (i.e., an order of magnitude greater) than that of the active impurity concentration at the crossover point.

Thus, although the present invention has been described with a certain degree of particularity, it is understood that the present disclosure has been made only by way of example and that various changes in the combination and arrangement of method steps may be resorted to without departing from the spirit and the scope of the invention as hereinafter claimed.

What is claimed is:

1. In the fabrication of a diffused junction semiconductor device, the steps of:

(a) diffusing active impurity atoms of one conductivity determining type into one surface of a semiconductor crystal body of a predetermined active impurity concentration and active impurity atoms of the opposite conductivity determining type in the opposite surface of said semiconductor crystal body to the crossover point at which the diffused active impurity concentration curves cross each other, (b) diffusing into said crystal body sufficient gold atoms so that the concentration of gold atoms in said body in the vicinity of said crossover point is substantially greater than that of the active impurity concentration of said diffused active impurities at said crossover point.

2. In the fabrication of a diffused junction semiconductor device, the steps of:

(a) simultaneously diffusing active impurity atoms of one conductivity determining type into one surface of a semiconductor crystal body of a predetermined active impurity concentration and active impurity atoms of the opposite active impurity concentration into the opposite surface of said semiconductor crystal body to the crossover point at which the diffused active impurity concentration curves cross each other, (b) diffusing into said crystal body sufficient gold atoms so that the concentration of gold atoms in said body in the vicinity of said crossover point is substantially greater than that of the active impurity concentration of said diffused active impurities at said crossover point.

3. In the method of fabricating a diffused PN junction semiconductor electrical translating device, the steps of:

(a) diffusing active impurity atoms of a predetermined conductivity type into one surface of a body of semiconductor material of the opposite conductivity type;

(b) diffusing active impurity atoms of the same conductivity as that of said body into a second surface of said body opposite said first surface, (c) the depths of each of the diffusion steps being such that there is effected an intersection of the active impurity concentration distributions of each of said active impurities to within the range of from 0.1 to 3 mils, and (d) diffusing into said body sufficient gold atoms so that the concentration of gold atoms in said body in the vicinity of said intersection is substantially greater than that of the active impurity concentration of said two diffused active impurities at said crossover point.

4. In a diffused junction semiconductor diode:

(a) a diffused region in one surface of said body of a predetermined conductivity type;

(b) a diffused region in the opposite surface of said body of the opposite conductivity type;

(c) regions extending into said body to the extent that the active impurity atoms diffused into each of said surfaces within said body extend to the crossover point of the active impurity concentration curves; and (d) a sufficient quantity of gold atoms in said body in the vicinity of said crossover point so that the concentration of gold is substantially greater than that of the active impurity concentration of said active impurity at said crossover point.

5. In the fabrication of a diffused junction semiconductor device, the steps of:

(a) diffusing active impurity atoms of one conductivity determining type into one surface of a semiconductor crystal body;

(a-1) said active impurity concentration at the crossover point being in the range from $10^{14}$ to $10^{16}$ atoms/cm.$^3$;

(b) diffusing into said crystal body sufficient atoms of gold to thereby compensate either P or N type semiconductor material to render it substantially less P and N type respectively to thereby produce nearly intrinsic resistivity material by such compensation in said body in the vicinity of said crossover point, the amount of gold being substantially greater than that of the active impurity concentration of said diffused active impurities at said crossover point;

(b-1) the concentration of gold at said crossover point being in the range from $1\times10^{14}$ to $1\times10^{17}$ atoms/cm.$^3$.

6. In the fabrication of a diffused junction semiconductor diode, the steps of:

(a) diffusing active impurity atoms of one conductivity determining type into one surface of a semiconductor crystal body having a thickness in the range from 3 mils to 15 mils of a predetermined impurity concentration and active impurity atoms of the opposite conductivity determining type into the opposite surface of said semiconductor crystal body substantially to the crossover point at which the two diffused active impurity concentration curves cross each other at said predetermined impurity concentration;

(b) diffusing into said body sufficient gold atoms so that the concentration of gold atoms in said body in the vicinity of said crossover point is substantially greater than that of the active impurity concentration of said two diffused active impurities;

(c) the extent of the crossover being in the range from 0.1 to 3 mils.

7. In the fabrication of a diffused junction silicon semiconductor device, the steps of:

(a) diffusing active impurity atoms of one conductivity determining type into one surface of a silicon semiconductor body, said body having a thickness in the range from 3 to 15 mils of a predetermined active impurity concentration and active impurity atoms of the opposite conductivity determining type in the opposite surface of said semiconductor body to the crossover point at which the diffused active impurity concentration curves cross each other, the extent of crossover being in the range from 0.1 to 3 mils;

(b) diffusing into said body sufficient gold atoms so that the concentration of gold atoms in said body in the vicinity of said crossover point is substantially greater than that of the active impurity concentration of said diffused active impurities at said crossover point.

8. In the fabrication of a diffused junction silicon semiconductor device, the steps of:

(a) diffusing active impurity atoms of one conductivity determining type into one surface of a silicon semiconductor crystal body, said body having a thickness in the range from 3 to 15 mils of a predetermined active impurity concentration and active impurity atoms of the opposite conductivity determining type in the opposite surface of said semiconductor crystal body to the crossover point at which the diffused active impurity concentration curves cross each other, the extent of crossover being in the range from 0.1 to 3 mils;

(b) diffusing into said crystal body sufficient gold atoms so that the concentration of gold atoms in said body in the vicinity of said crossover point is substantially greater than that of the active impurity concentration of said diffused active impurities at said crossover point.

9. In the fabrication of a diffused junction silicon semiconductor device, the steps of:

(a) simultaneously diffusing active impurity atoms of one conductivity determining type into one surface of a silicon semiconductor crystal body, said body having a thickness in the range from 3 to 15 mils of a predetermined active impurity concentration and active impurity atoms of the opposite active impurity concentration, the opposite surface of said semiconductor crystal body to the crossover point at which the diffused active impurity concentration curves cross each other, the extent of crossover being in the range from 0.1 to 3 mils, (b) diffusing into said crystal body sufficient gold atoms so that the concentration of gold atoms in said body in the vicinity of said crossover point is substantially greater than that of the active impurity concentration of said diffused active impurities at said crossover point.

10. In a diffused junction silicon semiconductor diode:

(a) a diffused region of a predetermined conductivity type in one surface of a silicon semiconductor body of the opposite conductivity type;

(b) a diffused junction in the opposite surface of said body of the same conductivity type as that of said body, said body being of a thickness in the range from 3 to 15 mils;

(c) said regions extending into said body to the extent that the active impurity atoms diffused into each of said surfaces within said body extend to the crossover point of the active impurity concentration curves to within the range of from 0.3 to 3 mils; and (d) a sufficient quantity of gold atoms in said body in the vicinity of said crossover point so that the concentration of gold is substantially greater than that of the active impurity concentration of said active impurity at said crossover point.

References Cited by the Examiner

UNITED STATES PATENTS

| | | | |
|---|---|---|---|
| 2,919,389 | 12/1959 | Heywang | 148—186 |
| 3,016,313 | 1/1962 | Pell | 148—188 |
| 3,067,485 | 12/1962 | Ciccolella | 148—186 |
| 3,079,512 | 2/1963 | Rutz | 148—186 |
| 3,108,914 | 10/1963 | Hoerni | 148—186 |

HYLAND BIZOT, *Primary Examiner.*

BENJAMIN HENKIN, *Examiner.*

H. W. CUMMINGS, *Assistant Examiner.*